United States Patent [19]

Okumura et al.

[11] 4,228,403

[45] Oct. 14, 1980

[54] SUBMULTIPLE-RELATED-FREQUENCY WAVE GENERATOR

[75] Inventors: Takatoshi Okumura; Akira Nakada; Yasuji Uchiyama; Eiichiro Aoki; Eiichi Yamaga; Akiyoshi Oya, all of Hamamatsu, Japan

[73] Assignee: Nippon Gakki Seizo Kabushiki Kaisha, Hamamatsu, Japan

[21] Appl. No.: 915,239

[22] Filed: Jun. 13, 1978

[30] Foreign Application Priority Data

Jun. 17, 1977 [JP] Japan ................................ 52-71822
Sep. 1, 1977 [JP] Japan ................................ 52-105105

[51] Int. Cl.[3] ........................ H03K 3/84; H03B 19/00; H03K 5/156

[52] U.S. Cl. ........................................ 328/15; 328/14; 328/16; 328/18; 328/61; 331/51

[58] Field of Search ........................ 328/14, 15, 16, 17, 328/18, 60, 61, 62; 331/51

[56] References Cited

U.S. PATENT DOCUMENTS

| | | | |
|---|---|---|---|
| 3,464,018 | 8/1969 | Cliff | 328/61 |
| 3,657,658 | 4/1972 | Kubo | 328/61 |
| 4,016,495 | 4/1977 | Machanian | 328/18 |
| 4,025,865 | 5/1977 | Munday et al. | 328/14 |

*Primary Examiner*—John S. Heyman
*Attorney, Agent, or Firm*—Spensley, Horn, Jubas & Lubitz

[57] ABSTRACT

A digital oscillator generates a basic pulse having a period which is a predetermined large number of times of a clock pulse period. During the basic pulse period are allotted a predetermined small number of time slots defining submultiple frequency channels. There is provided a shift register having the channel number of stages, each stage being assigned to each channel. The contents of the respective stages are changed at respectively different periods which are multiples of the basic pulse period. The contents are taken out timewise-serially, one at a time, stage by stage, and superimposed on the basic pulse to constitute a time-division-multiplexed wave data signal. The delivered signal is demultiplexed to form individual waves having respectively different frequencies which are submultiple-related to the frequency of the basic pulse. This generator is very suitable for electronic musical instruments, as a single line transmits plural wave data.

11 Claims, 11 Drawing Figures

SUBMULTIPLE-RELATED-FREQUENCY WAVE GENERATOR

BACKGROUND OF THE INVENTION

This invention relates to an oscillatory wave generator which generates a plurality of waves respectively having submultiple related frequencies and is particularly suitable for tone generators in electronic musical instruments.

The tone generator of an electronic musical instrument, which employs a frequency division circuit, is well known in the art. In this tone generator, the signal having the highest frequency is subjected successively to frequency division with a plurality of frequency division circuits, thereby to obtain in parallel a plurality of square wave signals having octavely related frequencies. For instance, if it is assumed that the number of notes in one octave is twelve (12) and the number of octaves is five (5), then sixty (60) different signals are provided in parallel. These signals, namely, tone source signals are selectively utilized in response to key depression in a keyboard. In the case where a plurality of tone production channels are provided to make it possible to simultaneously produce a plurality of tones, all of the signals are supplied to each of the tone production channels, so that in each tone production channel, the signals of tones assigned thereto are selected. In this case, as all of the signals are supplied to each of the tone production channels as described above, it is necessary to provide a large number of signal supplying lines. This is one of the disadvantages accompanying the conventional tone generator described above. For instance, if the number of channels is twelve (12), then 720 ($=60\times12$) signal supplying lines are required. Reduction of the lines may be accomplished by employing a method in which frequency division circuits are provided for each channel, and the signal having the highest frequency out of the frequencies of the notes (C–B) is applied to each frequency division circuit. However, this method is still disadvantageous in that, since the frequency divisions are effected individually in the channels, when tones having the same note are assigned to different channels, their phases may sometimes be opposite to each other. For instance, in the case where tones having the same note are assigned to two channels, if the phases of the frequency division outputs of the two channels are opposite to each other, the tones produced by the two channels cancel each other; that is, no tone is produced at all.

SUMMARY OF THE INVENTION

Accordingly, an object of this invention is to eliminate all of the above-described drawbacks accompanying a conventional tone generator in an electronic musical instrument. More specifically, an object of the invention is to provide an oscillatory wave generator in which a plurality of frequency data are produced in a time division multiplexed fashion, whereby it is made possible to deliver these data with signal supplying lines of a number which is smaller than the number of the waves to be produced.

Another object of the invention is to provide a wave generator in which a plurality of square wave signals consisting of binary logical levels "1" and "0" are generated digitally in superposition state, and whenever the logical level of at least the square wave signal highest frequency is switched, the logical level data of the other square wave signals are generated in a series mode, thereby to carry out the multiplexing of a plurality of signals.

A further object of the invention is to provide a wave generator in which the logical level data of the square wave signals generated in a series mode are converted into parallel data, which are stored and held, whereby a plurality of lasting square wave signals are obtained in parallel state. In application of this invention to the tone generator of an electronic musical instrument, a plurality of octavely related frequency data are successively generated in a series mode thereby to effect the multiplexing of the plurality of octavely related frequency waves and the octavely related frequency data trains thereof are converted into parallel data, which are individually stored, as a result of which the plurality of waves having octavely related frequencies in the form of a square wave can be obtained separately.

DETAILED DESCRIPTION OF THE INVENTION

Figure 1:
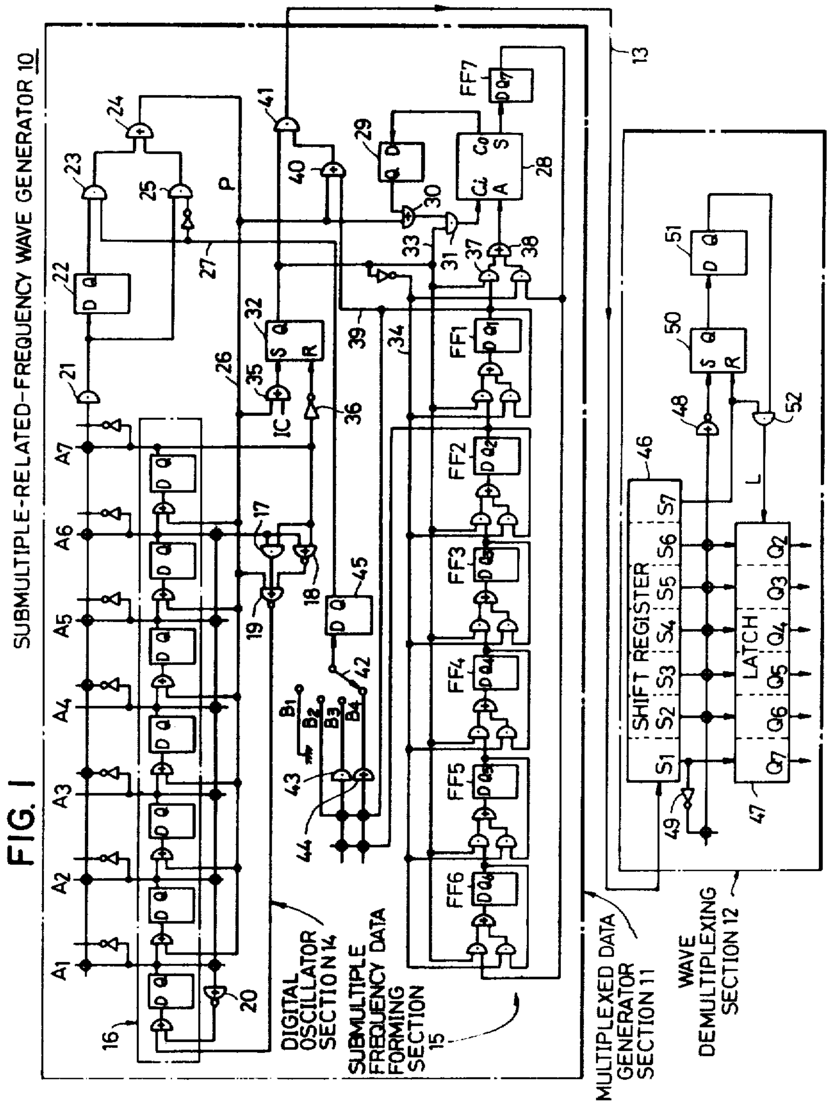
FIG. 1 is a circuit diagram showing an embodiment of the oscillatory wave generator according to the invention.

Referring to FIG. 1, a wave generator 10 according to this invention is so designed as to generate a plurality of waves having submultiple-related frequencies as would usually be obtained by subjecting a signal having a certain frequency successively to frequency division, that is, a plurality of frequency divided signals.

The signal generator 10 has a multiplexed data generator section 11, which operates to generate in a multiplexed fashion a plurality of frequency data from a basic pulse having a certain frequency (basic frequency) and to apply the multiplexed wave data through a line 13 to a wave demultiplexing section 12. The wave demultiplexing section 12 operates to pick up individually the multiplexed wave data and to place them in a usable parallel state.

Figure 2:
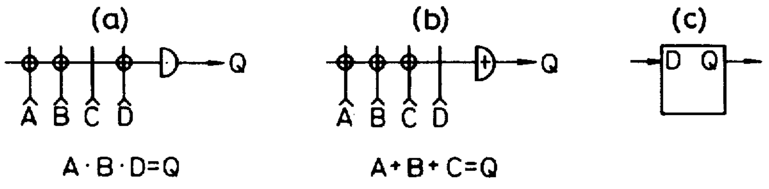
FIGS. 2(*a*) through 2(*c*) are diagrams for explaining a manner of illustration of circuit elements employed in the wave generator.

In the accompanying drawings, among various AND circuits and OR circuits, multi-input type AND circuits and multi-input type OR circuits are indicated by a manner which are illustrated in the parts (a) and (b) of FIG. 2. In this way, one input line is drawn on the input side, and a plurality of lines are drawn perpendicularly to the one input line, and in addition the intersection of the signal line for a signal to be inputted to the circuit and the aforementioned input line is encircled. For instance, the condition equation of an AND circuit shown in the part (a) of FIG. 2 is $A \cdot B \cdot C = Q$, while the condition equation of an OR circuit shown in the part (b) of FIG. 2 is $A + B + C = Q$. In addition, a delay flip-flop is illustrated as in the part (c) of FIG. 2. A clock pulse for controlling the delay flip-flops is not shown; however, it should be noted that all the delay flip-flops are controlled by a common clock pulse. The period of the clock pulse will be referred to as "one-bit time" hereinafter.

The multiplexed data generator section 11 can be generally divided into a digital oscillator section 14 and a submultiple frequency data forming section 15. In the digital oscillator section 14, clock pulses are counted at a desired frequency division factor to provide a basic pulse signal p having a desired frequency, namely having a period which is a predetermined number of times of the clock pulse period. In the submultiple frequency data forming section 15, digital data (or submultiple frequency data) representing a plurality of octavely-related frequency waves which would usually be obtained by frequency dividing a fundamental pulse signal successively are formed, and are outputted in a series mode (i.e. time wise serially) through a line 13. The digital oscillator section 14 includes a maximum length counter which comprises: a 7-stage/1-bit shift register 16 having seven delay flop-flops and seven OR circuits alternately cascade-connected; an EXCLUSIVE OR circuit made up of an AND circuit 17 which receives data $A_6$ and $A_7$ from the sixth and seventh stages, of the shift register 16, a NOR circuit 18, and a NOR circuit 19 which receives the outputs of the AND circuit 17 and NOR circuit 18 and the basic pulse signal P; and a NOR circuit 20 which receives data $A_1$ through $A_6$ from the first through sixth stages of the shift register 16. When the content of the maximum length counter reaches a preset value, an output of the level "1" having one bit-time width is provided by an AND circuit 21. This output "1" is supplied, as the basic pulse signal P, through a delay flip-flop 22, and AND circuit 23 and an OR circuit 24, or through an AND circuit 25 and the OR circuit 24. The maximum length counter is set in an initial state with the aid of the basic pulse signal applied thereto through a line 26. Accordingly, in the maximum length counter comprising the shift register 16, etc, the counting operation is repeated from its initial state whenever the basic pulse signal P is applied thereto. The modulo number of the maximum length counter, that is, the oscillation period (pulse interval) of the digital oscillator section 14 is determined depending on the input connection states of the AND circuit 21 and on the control of whether or not the output of the AND circuit 21 passing through the delay flip-flop 22 is picked up as the basic pulse signal P.

The output data $A_1$ through $A_7$ provided at the stages of the shift register 16 are applied to the AND circuit 21 directly or through inverters. In the example shown in FIG. 1, the output data $A_1$, $A_2$, $A_5$, $A_6$ and $A_7$ are applied directly to the AND circuit 21, and the output data $A_3$ and $A_4$ are applied through the respective inverters to the AND circuit 21. Therefore, when the content of the maximum length counter, that is, the data $A_1$–$A_7$ of the shift register 16, is "1 1 0 0 1 1 1", the input condition $A_1 \cdot A_2 \cdot \bar{A}_3 \cdot \bar{A}_4 \cdot A_5 \cdot A_6 \cdot A_7$ is satisfied, and the output "1" is provided by the AND circuit 21.

When a signal on a control line 27 is at a logical level "1" (hereinafter referred to as merely as a level "1", or "1", when applicable), the AND circuit 23 is enabled, while the AND circuit 25 is disabled, as a result of which the output signal delayed by one-bit time by the delay flip-flop 22 is selected. When the signal on the control line 27 is at a logical level "0" (hereinafter referred to merely as a level "0", or "0" when applicable), the AND circuit 23 is disabled, while the AND circuit 25 is enabled, as a result of which the output of the AND circuit 21 is selected as it is (without being delayed). Accordingly, in the case where the input connection state of the AND circuit 21 is so set up that the data contents $A_1$–$A_7$ obtained when N clock pulses (not shown) are applied to the flip-flops of the shift register 16 after the maximum length counter is set in the initial state with the aid of the pulse signal P through the line 26 are detected, if the signal on the control line 27 is at "0", the basic pulse signal P is provided at the intervals of N clock pulses; and if the signal on the control line 27 is at "1", the basic pulse signal P is provided at the intervals of (N+1) clock pulses. Thus, in the digital oscillator section 14, clock pulses for the delay flip-flops are subjected to frequency division to provide the basic pulse signal, and in this case the frequency division factor is substantially determined by the input connection state of the AND circuit 21 and is slightly changed according to the signal on the control line 27. The actual oscillation period of the basic pulse signal P obtained through frequency division is scaled (measured, graduated) by the clock pulse period (approximately 1 $\mu s$ for instance) for the delay flip-flops.

The submultiple frequency data forming section 15 comprises: a memory register having delay flip-flops FF1 through FF7 constituting a shift register of seven stages to store seven wave data and being capable of carrying out a series shift operation; a 1-bit adder 28; and a delay flip-flop 29 operating to delay the carry output Co of the adder 28 by one bit time and to feed back the carry output Co thus delayed to the carry input terminal Ci of the adder 28 through an OR circuit 30 and an AND circuit 31 thus constituting a binary adder of a series type. That is, the submultiple frequency data forming section 15 is so designed as to carry out a series addition operation. In the submultiple frequency data forming section 15, the contents of the delay flip-flops FF1 through FF7 respectively determine the states of submultiple frequency waves and are successively shifted in a series mode to add the pulse signal P applied thereto from the oscillator section 14 to the data of the least significant bit (the bit of the delay flip-flop FF1 at the initial state of every circulation) during the series addition operation. The control as to whether the series addition operation, namely, the shift operation of the delay flip-flop FF1 through FF7, should be carried out or the memory operation should be carried out is determined by the output of a set-reset type flip-flop 32. When the output of the flip-flop 32 is at "1", the signal on a shift line 33 is raised to "1", while the signal on a memory line 34 is lowered to "0", as a result of which the contents stored in the data forming section 15 are successively shifted, upon clock pulses (not shown), rightward from a higher bit flip-flop (FF7) to a lower bit flip-flop (FF1), and the output of the least significant bit delay flip-flop FF1 is added to the level "1" of the basic pulse signal P or to the carry signal from the delay flip-flop 29 in the adder 28, and the result of addition is inputted to the most significant bit delay flip-flop FF7. On the other hand, when the output of the flip-flop 32 is at "0", the signal on the memory line 34 is raised to "1" while the signal on the shift line 33 is lowered to "0", as a result of which the shifting operation is prevented and the data stored in the delay flip-flops FF1 through FF7 are self-held.

Figure 3:
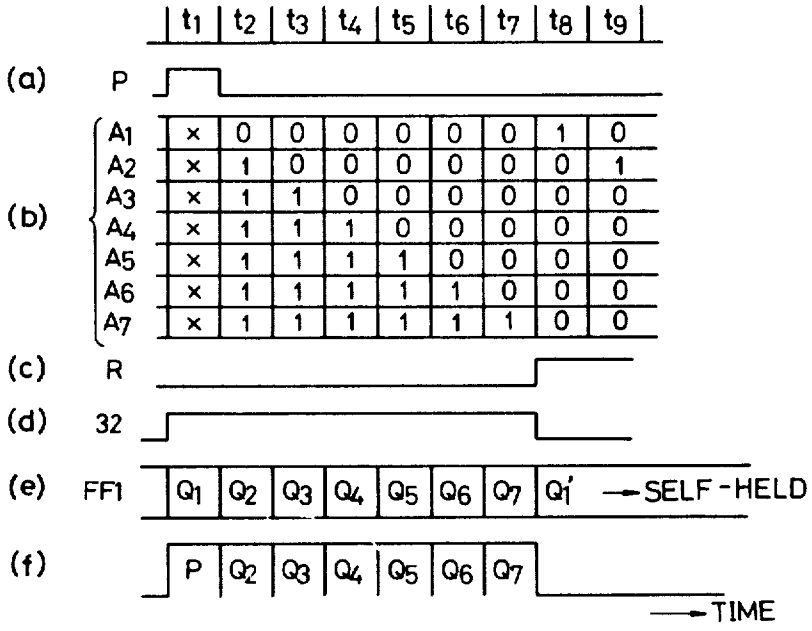
FIG. 3 is a timing chart for explaining the operation of a multiplexed data generator section shown in FIG. 1.

The flip-flop 32 maintains its set output "1" for the period of bit-time corresponding to the number of stages of the register comprising the delay flip-flops FF1 through FF7. This will be described with reference to FIG. 3. When a single basic pulse signal P is provided by the oscillator section 14 at the time slot $t_1$ as indicated in the part (a) of FIG. 3, the flip-flop 32 is set by the output of the OR circuit 35. In this operation, the signal "1" is inputted into the second through seventh stages of the shift register 16 through the line 26, while the signal "0" is inputted into the first stage through the line 26 and the NOR circuit 19. Therefore, one bit-time later, or at the time slot $t_2$, the data $A_1$–$A_7$ is "0 1 1 1 1 1 1" as indicated in the part (b) of FIG. 3. The data are successively shifted right, that is, the data $A_1$ through $A_7$ are changed as indicated in the part (b) of FIG. 3, and finally seven bit-time later, or at the time slot $t_8$, the data $A_7$ of the seventh stage of the shift register 16 is lowered to "0". This data $A_7$ is inverted by an inverter 36 as indicated in the part (c) of FIG. 3, and is then applied to the reset input R of the flip-flop 32. Accordingly, the flip-flop 32 is maintained set for the period of seven bit-times (corresponding to the time slots $t_1$–$t_7$) after the basic pulse signal P has been raised to "1", thereby to provide the set output "1". A signal IC applied to the OR circuit 35 is an initial clear signal which is raised to "1" when the power switch is turned on.

The data stored in the delay flip flops FF1 through FF7 in the memory state (when the signal on the memory line 34 is at "1") will be designated by reference characters $Q_1$ through $Q_7$, respectively. Then, the data outputted by the delay flip-flop FF1 in the shift state (when the signal on the shift line 33 is at "1") is as indicated in the part (e) of FIG. 3. That is, for the period of time slots $t_1$–$t_7$, the data $Q_1$ through $Q_7$ stored in the register (FF1 through FF7) are outputted in a series mode by the delay flip-flop FF1 successively starting from the least significant bit. This output of the delay flip-flop FF1 is applied through an AND circuit 37 and an OR circuit 38 to the adder 28.

Now, the series addition operation will be described. The fundamental pulse signal P is applied through the OR circuit 30 and the AND circuit 31 to the addition input terminal Ci of the adder 28 at the time slot $t_1$. The AND circuit 31 is maintained enabled for the period of from the time slot $t_1$ to the time slot $t_7$ by the signal "1" on the shift line 33. At the time slot $t_1$, the least significant bit data $Q_1$ is applied to the adder 28 by the delay flip-flop FF1, and therefore the least significant bit data $Q_1$ is added to the basic pulse signal P. The result of addition (which will be designated by $Q_1'$) is applied through the output terminal S to the delay flip-flop FF7, and the carry output Co in this operation is applied to the delay flip-flop 29. At the next time slot $t_2$, the pulse signal P is eliminated, but the carry signal from the lower significant bit temporarily held in the delay of flip-flop 29 is applied to the addition input terminal Ci and is edded to the data $Q_2$. Thereafter, similarly as in the above-described cases, a carry signal from the addition result of a lower significant bit is added to a higher significant bit data ($Q_3$–$Q_7$), and finally at the time slot $t_7$ the series addition operation is ended. Upon completion of the series addition operation, or at the time slot $t_8$, the output of the flip-flop 32 is switched to "0", while the signal on memory line 34 is raised to "1". Therefore, the addition results obtained at the time slots $t_1$ through $t_7$ are self-held by the delay flip-flops FF1 through FF7. Accordingly, the weights of the data $Q_1$ through $Q_7$ stored in the delay flip-flops FF1 through FF7 in the memory state are $2^1$, $2^2$, $2^3$, $2^4$, $2^5$, $2^6$ and $2^7$ for the delay flip-flops FF1, FF2, FF3, FF4, FF5, FF6 and FF7, respectively, with respect to the pulse signal P. In consequence, the basic pulse signal P is frequency-divided into a plurality of stages of signals, and the frequency division factors thereof corresponds to the above-described weights.

The submultiple (octavely related) frequency wave data $Q_1$–$Q_7$ formed by the submultiple frequency data forming section 15 as described above, are outputted in a series mode through a line 39, an OR circuit 40, and an AND circuit 41. The AND circuit 41 is enabled by the output of the flip-flop 32 only for the period of time slots $t_1$–$t_7$, and only for this period the submultiple frequency data are outputted. That is, the output data $Q_1$–$Q_7$ of the delay flip-flop FF1 which are provided as indicated in the part (e) of FIG. 3 during the shift period of time slots $t_1$–$t_7$ are supplied to the line 13 through the line 39, the OR circuit 40 and the AND circuit 41. Since the above-described series addition operation is done in the rear stages of the delay flip-flop FF1, the submultiple frequency data $Q_1$–$Q_7$ outputted through the line 39 can represent the preceding series addition result. Incidentally, at the time slot $t_1$, the basic pulse signal P is applied through the OR circuit 40 and the AND circuit 41 to the line 13. This basic pulse signal P is at "1" at the time slot $t_1$ at all times, and therefore the basic pulse signal P takes precedence over the submultiple frequency data $Q_1$, and thus the latter $Q_1$ is cancelled. Accordingly, the contents of the data supplied from the multiplexed data generator section 11 are as indicated in the part (f) of FIG. 3. That is, by arranging the submultiple frequency wave data $Q_2$–$Q_7$ in a series mode, multiplexing of submultiple frequency wave signals is practically obtained. The basic pulse signal P appearing at the top of the submultiple frequency wave data $Q_2$–$Q_7$ is utilized as a timing signal (P) when the submultiple frequency wave data $Q_2$–$Q_7$ are separately picked up in the wave demultiplexing section 12. Superposition of the timing signal (P) on the submultiple frequency wave data ($Q_2$–$Q_7$) is very important for identifying the respective time slots occupied by the submultiple frequency wave data.

In the example shown in FIG. 1, the generation interval of the basic pulse signal P can be slightly changed according to predetermined combinations during the production of four pulse signals P. The combinations are dependent on the set positions of a switch 42 having four terminals $B_1$ through $B_4$. No signal "1" is applied to the terminal $B_1$ grounded, during the provision of four basic pulse signals P. The least significant bit frequency division data $Q_1$ from the delay flip-flop FF1 in the frequency division data forming section 15 is applied to the terminal $B_2$, and the signal "1" is applied thereto twice during the provision of four basic pulse signals P.

The submultiple frequency wave data $Q_1$ and $Q_2$ held in the delay flip-flops FF1 and FF2 are applied to an AND circuit 43 and an OR circuit 44. The output of the AND circuit 43 is applied to the terminal $B_3$, while the output of the OR circuit 44 is applied to the terminal $B_4$. Therefore, while four basic pulse signals are outputted, the signal "1" is applied to the terminal $B_3$ only once. On the other hand, while four basic pulse signals P are outputted, the signal "1" is applied to the terminal $B_4$ three times. The relationships between the two least significant bits $Q_1$ and $Q_2$ of the submutiple frequency wave data $Q_1$ and $Q_2$ and the values of signals applied to the terminals $B_1$ through $B_4$ of the switch 42 are as indicated in Table 1 below:

TABLE 1

| $Q_2$ | $Q_1$ | $B_4$ | $B_3$ | $B_2$ | $B_1$ |
|---|---|---|---|---|---|
| 0 | 0 | 0 | 0 | 0 | 0 |
| 0 | 1 | 1 | 0 | 1 | 0 |
| 1 | 0 | 1 | 0 | 0 | 0 |
| 1 | 1 | 1 | 1 | 1 | 0 |

The output of the switch 42 is applied through a delay flip-flop 45 to the control line 27, thereby to control the frequency division factor of the digital oscillator section 14, that is, the generation interval of the basic pulse P. In the case where the frequency division factor set by the AND circuit 21 is N as described before, when the signal on the control line 27 is raised to "1", the basic pulse signal P is produced at the frequency division factor of (N+1); and when the signal on the line 27 is switched to "0", it is produced at the frequency division factor of N. Accordingly, with respect to the frequency division factor for generating the basic pulse signal P in the digital oscillator section 14, the modulo-N operation is effected at all times when the armature of the switch 42 is connected to the terminal $B_1$; the modulo-N and the modulo-(N+1) operations are repeated when the armature of the switch 42 is connected to the terminal $B_2$; after the modulo-N operation has been effected three times, the modulo-(N+1) operation is effected only once when the armature of the switch 42 is connected to the terminal $B_3$; and when the armature of the switch 42 is connected to the terminal $B_4$, the modulo-(N+1) operation is effected three times after the modulo-N has been effected once.

Figure 4:
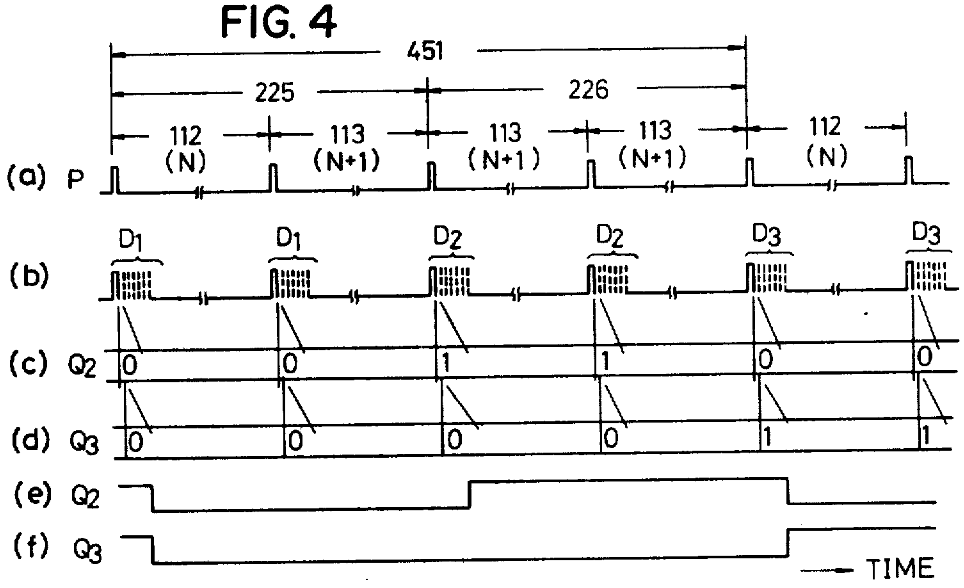
FIG. 4 is a timing chart for explaining a manner of generation of multiplexed data from the multiplexed data generator section.

In the example shown in FIG. 1, the armature of the switch 42 is connected to the terminal $B_4$. And the input condition of the AND circuit 21 in the digital oscillation section 14 is set to "$A_1.A_2.\bar{A}_3.\bar{A}_4.A_5.A_6.A_7$". This means that the maximum length counter is set to modulo 112 (N=112). The basic pulse signal P generation state in this case is as indicated in the part (a) of FIG. 4. The numbers indicated in the part (a) of FIG. 4 are the numbers of clock pulses which are included in the ranges covered thereby, that is, the frequency division factors based on the clock pulses. As was described before, the submultiple frequency wave data $Q_2$ through $Q_7$ in succession with the basic pulse signal P are outputted by the AND circuit 41. Shown in the part (b) of FIG. 4 is the generation state of the submultiple frequency wave data trains $D_1$, $D_2$, $D_3$ . . . each of which includes the basic pulse signal P at the top and the submultiple frequency wave data $Q_2$ through $Q_7$ in succession therewith as indicated in the part (f) of FIG. 3. As the submultiple frequency wave data $Q_2$ having the smallest frequency division factor is obtained by subjecting the basic pulse signal P to ¼ frequency division, its value is changed from "0" to "1" or from "1" to "0" whenever two basic pulse signals P are provided. Therefore, it is assumed that the submultiple frequency wave data trains are generated with the generation period of the basic pulse signal P, the data trains having the same contents are provided continuously twice as $D_1$, $D_1$; $D_2$, $D_2$; . . . . Although the circuitry may be so designed that each of the frequency division trains $D_1$, $D_2$, $D_3$ . . . is generated only once, no trouble is caused even if the submultiple frequency wave data trains are provided continuously twice as was described above. As one example of the data contents of the frequency division data trains $D_1$, $D_2$, $D_3$ . . . , the frequency division data $Q_2$ and $Q_3$ are indicated in the parts (c) and (d) of FIG. 4, respectively. The variations of the data contents of the frequency division trains $D_1$, $D_2$, . . . effected with the lapse of a longer period of time are indicated in Table 2 below:

TABLE 2

| | $Q_2$ | $Q_3$ | $Q_4$ | $Q_5$ | $Q_6$ | $Q_7$ | | $Q_2$ | $Q_3$ | $Q_4$ | $Q_5$ | $Q_6$ | $Q_7$ |
|---|---|---|---|---|---|---|---|---|---|---|---|---|---|
| $D_1$ | 0 | 0 | 0 | 0 | 0 | 0 | $D_{21}$ | 0 | 0 | 1 | 0 | 1 | 0 |
| $D_2$ | 1 | 0 | 0 | 0 | 0 | 0 | $D_{22}$ | 1 | 0 | 1 | 0 | 1 | 0 |
| $D_3$ | 0 | 1 | 0 | 0 | 0 | 0 | $D_{23}$ | 0 | 1 | 1 | 0 | 1 | 0 |
| $D_4$ | 1 | 1 | 0 | 0 | 0 | 0 | $D_{24}$ | 1 | 1 | 1 | 0 | 1 | 0 |
| $D_5$ | 0 | 0 | 1 | 0 | 0 | 0 | $D_{25}$ | 0 | 0 | 0 | 1 | 1 | 0 |
| $D_6$ | 1 | 0 | 1 | 0 | 0 | 0 | $D_{26}$ | 1 | 0 | 0 | 1 | 1 | 0 |
| $D_7$ | 0 | 1 | 1 | 0 | 0 | 0 | $D_{27}$ | 0 | 1 | 0 | 1 | 1 | 0 |
| $D_8$ | 1 | 1 | 1 | 0 | 0 | 0 | $D_{28}$ | 1 | 1 | 0 | 1 | 1 | 0 |
| $D_9$ | 0 | 0 | 0 | 1 | 0 | 0 | $D_{29}$ | 0 | 0 | 1 | 1 | 1 | 0 |
| $D_{10}$ | 1 | 0 | 0 | 1 | 0 | 0 | $D_{30}$ | 1 | 0 | 1 | 1 | 1 | 0 |
| $D_{11}$ | 0 | 1 | 0 | 1 | 0 | 0 | $D_{31}$ | 0 | 1 | 1 | 1 | 1 | 0 |
| $D_{12}$ | 1 | 1 | 0 | 1 | 0 | 0 | $D_{32}$ | 1 | 1 | 1 | 1 | 1 | 0 |
| $D_{13}$ | 0 | 0 | 1 | 1 | 0 | 0 | $D_{33}$ | 0 | 0 | 0 | 0 | 0 | 1 |
| $D_{14}$ | 1 | 0 | 1 | 1 | 0 | 0 | $D_{34}$ | 1 | 0 | 0 | 0 | 0 | 1 |
| $D_{15}$ | 0 | 1 | 1 | 1 | 0 | 0 | $D_{35}$ | 0 | 1 | 0 | 0 | 0 | 1 |
| $D_{16}$ | 1 | 1 | 1 | 1 | 0 | 0 | $D_{36}$ | 1 | 1 | 0 | 0 | 0 | 1 |
| $D_{17}$ | 0 | 0 | 0 | 0 | 1 | 0 | . | | | | | | |
| $D_{18}$ | 1 | 0 | 0 | 0 | 1 | 0 | . | | | | | | |
| $D_{19}$ | 0 | 1 | 0 | 0 | 1 | 0 | . | | | | | | |
| $D_{20}$ | 1 | 1 | 0 | 0 | 1 | 0 | $D_{128}$ | 1 | 1 | 1 | 1 | 1 | 1 |

Among the wave data $Q_2$ through $Q_7$, the submultiple frequency wave data $Q_2$ is repeatedly switched to "1" and "0" with the shortest period. Therefore, an oscillatory wave generated from the data $Q_2$ is the highest in frequency. As is apparent from the numbers indicated in the part (a) of FIG. 4, the wave signal obtained from the data $Q_2$ is one which is obtained by subjecting the delay flip-flop driving clock pulse to 1/451 frequency division. That is, the data $Q_2$ is obtained by subjecting the basic pulse signal P to ¼ frequency division, and in this example after the 1/112 frequency division of the clock pulse is carried out once, the 1/113 frequency division is carried out three times, so that four basic pulse signals P are provided. The signals obtained from the data $Q_3$, $Q_4$, $Q_5$, $Q_6$ and $Q_7$ are those which are obtained by subjecting the highest frequency signal corresponding to the data $Q_2$ to ½, ¼, ⅛, 1/16 and 1/32 frequency division, respectively. Thus, the data of a plurality of octavely-related wave signals are generated in a time division multiplexed way.

The reason for the provision of the switch 42 to slightly change the frequency division factor is to provide slightly deviated frequency division factors which cannot be completely divided by using only the maximum length counter having the seven-stage shift register 16. In other words, if the AND circuit 21 is operated in the case when the maximum length counter operates on the modulo-N, then the data $Q_2$ can be obtained with frequency division factors slightly different as 4N, (4N+1), (4N+2) and (4N+3).

As is apparent from the above description whenever the basic pulse signal P is provided, the submultiple frequency wave data $Q_2$ through $Q_7$ arranged in a series mode are outputted by the multiplexed data generator section 11. These time-division multiplexed wave data signals are applied through the line 13 to a shift register 46 in the wave demultiplexing section 12. The shift register 46 and delay flip-flops in the section 12 are operated synchronously by the same clock pulse as that for the section 11. The shift register 46 has seven stages, and carries out a series shift operation in the direction of the first stage $S_1$ toward the seventh stage $S_7$. The basic pulse signal P and the wave data $Q_2$–$Q_7$ are successively applied to the shift register 46 through the line 13. The shift register 46 operates to rearrange the series data $Q_2$–$Q_7$ into parallel data $Q_2$–$Q_7$, which are stored in a latch circuit 47. In this case, the basic pulse signal P is utilized as a timing signal controlling the latch timing of the latch circuit 47.

Since the basic pulse signal P is delivered after the data $Q_2$ through $Q_7$, no signal is provided on the line 13 (the line 13 being at "0") for the period of at least six bit-times immediately before the provision of the basic pulse signal P. Accordingly, when the basic pulse signal P is inputted into the first stage $S_1$ of the shift register 46, the outputs of the second through seventh stages $S_2$–$S_7$ representative of the signal state of the six bit-times immediately before that are all at "0". This is indicated in correspondence to the timing $t_1'$ in FIG. 5. A NOR circuit 48 in the section 12 detects the time instant of the timing $t_1'$, that is, the time instant of arrival of the submultiple frequency wave data train $D_1$ or $D_2$ or $D_3$ or . . . When the basic pulse signal P is inputted into the first stage $S_1$ of the shift register 46, the output of the first stage $S_1$ is raised to "1", while the output of an inverter 49 is switched to "0". As the output of the inverter 49 and the outputs of the second through seventh stages $S_2$–$S_7$ are applied to the NOR circuit 48, the latter 48 provides the output "1" at the time instant of timing $t_1'$. The output "1" of the NOR circuit 48 is applied to the set terminal S of a set-reset type flip-flop 50. As a result, the flip-flop 50 is placed in a set state as indicated in the part (b) of FIG. 5, and its set output is applied to an AND circuit 52 after being delayed by one bit-time by a delay flip-flop 51 as indicated in the part (c) of FIG. 5.

Figure 5:
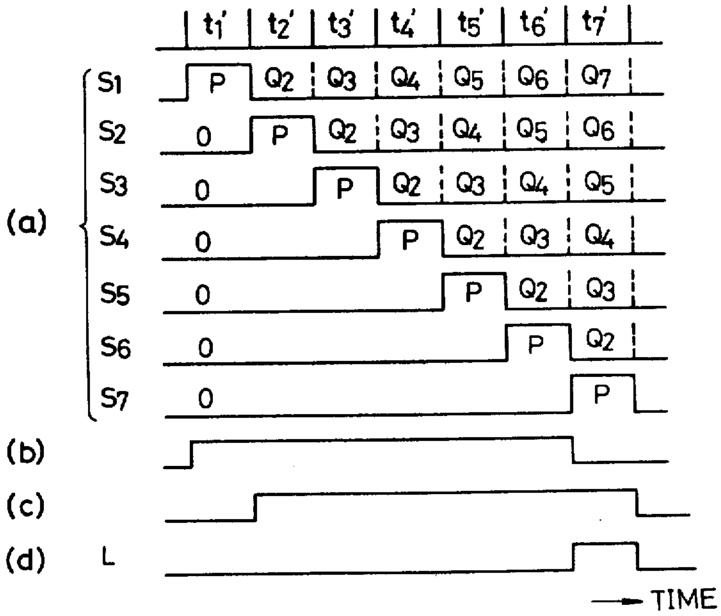
FIG. 5 is a timing chart for explaining the operation of a wave demultiplexing section shown in FIG. 1.

For the period from timing $t_1'$ to timing $t_7'$, the submultiple frequency wave data $Q_2$ through $Q_7$ are successively shifted in the stages $S_1$ through $S_7$ of the shift register 46. At the timing $t_7'$, the basic pulse signal P is shifted to the seventh stage of the shift register 46, and all the submultiple frequency wave data $Q_7$, $Q_6$ . . . $Q_2$ are held in the first through sixth stages $S_1$–$S_6$, respectively. At the timing $t_7'$, the signal "1" (signal P) outputted by the seventh stage of the shift register 46 is applied to the reset input R of the flip-flop 50 and to the AND circuit 52. Therefore, the flip-flop 50 is reset as indicated in the part (b) of FIG. 5, while one bit-time later the output of the delay flip-flop 51 is decayed to "0". Accordingly, at the timing $t_7'$, the AND circuit 52 is still maintained enabled, and a latch signal L as indicated in the part (d) of FIG. 5 is applied to the latch circuit 47 by the AND circuit 52. In the latch circuit 47, the data $Q_7$, $Q_6$ . . . $Q_2$ held in the first through sixth stages $S_1$–$S_6$ of the shift register 46 are stored in a parallel mode in six memory position. Thus, the data $Q_2$–$Q_7$ intermittently generated with the generation period of the basic pulse signal P are stored and held in the latch circuit 47, whereby they are converted into lasting signals. The levels ("1" and "0") of the signals outputted from the memory positions of the latch circuit 47 are changed whenever the levels of the data $Q_2$–$Q_7$ applied through the line 13 are changed. Accordingly, six signals (square wave pulses) corresponding to six multiplexed data $Q_2$–$Q_7$ outputted by the multiplexed data generator section 11 are individually outputted from the latch circuit 47, or the wave demultiplexing section 12. The parts (e) and (f) of FIG. 4 show the square wave signal outputtted by the latch circuit 47 on the basis of the submultiple frequency wave data $Q_2$ and $Q_3$.

Figure 6:
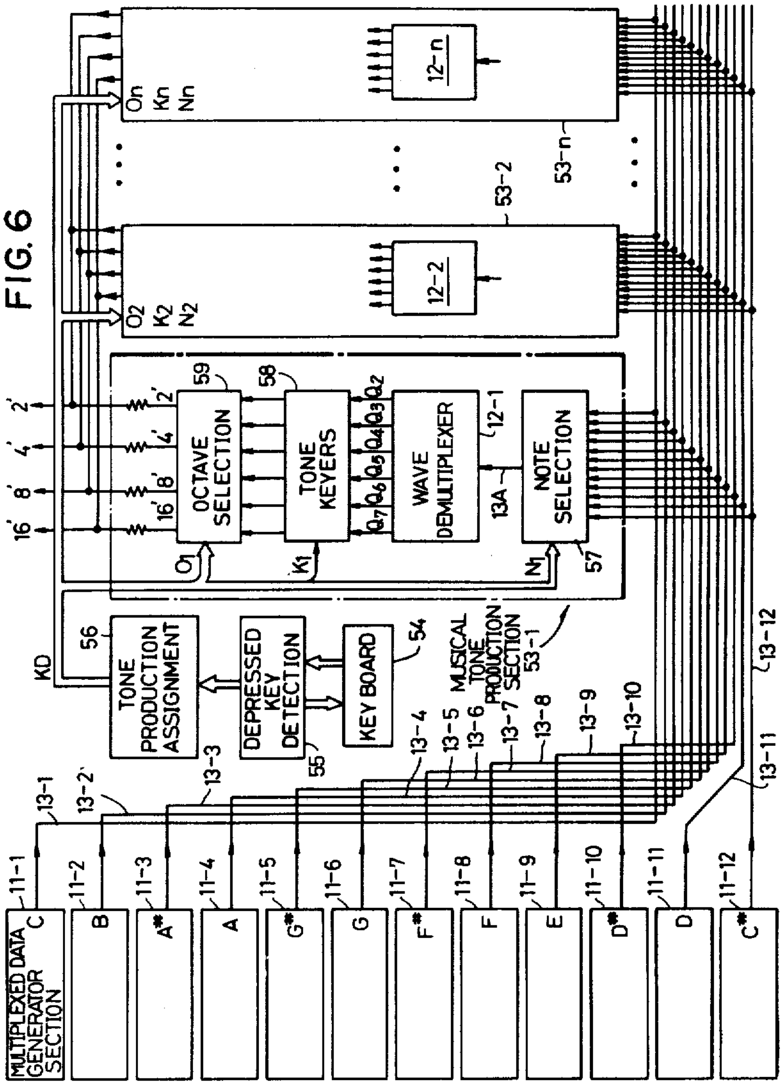
FIG. 6 is a block diagram showing an example of a case where the invention has been applied to a tone generator of an electronic musical instrument.

FIG. 6 illustrates one example of the wave generator according to this invention, which is applied to a tone generator or an electronic musical instrument. In the case where the maximum number of simultaneously produced tones is n, musical tone production systems 53-1 through 53-n are provided for n tone production channels, respectively. The arrangement of the musical tone production system 53-1 only is roughly illustrated; however, the arrangements of the other musical tone production systems 53-2 through 53-n are similar to that of the system 53-1.

A depressed key detecting circuit 55 operates to detect a depressed key in a keyboard 54 to supply information on the depressed key to a tone production assignment circuit 56. The tone production assigning circuit 56 is to assign the tone production of a depressed key to a suitable tone production channel. A key data KD of a depressed key is provided in correspondence to a tone production channel thus selected. The key data KD includes note data $N_1$ . . . representative of the note of a depressed key assigned to the channel, octave data $O_1$ . . . representative of the octave range of the key, and key-on data $K_1$ whose level is raised to "1" when the key is maintained depressed, but is switched to "0" when the key is released. The key data are provided respectively for the channels, and a key data provided for a channel is utilized in the musical tone generation system (53-1 through 53-n) corresponding to the channel. For instance, the key data (the note data $N_1$, the octave data $O_1$, and the key-on data $K_1$) of a key assigned to the first channel is utilized in the musical tone production system 53-1 corresponding to the first channel. The key data (the note data $N_2$, the octave data $O_2$, the key-on data $K_2$) of a key assigned to the second channel is utilized in the musical tone production system 53-2 corresponding to the second channel. Similarly, the key data (the note data $N_n$, the octave data $O_n$, the key-on data $K_n$) of a key assigned to the n-th channel is utilized in the musical tone production system 53-n corresponding to the n-th channel.

A channel processor described in the specification of U.S. Pat. No. 4,114,495 entitled "Channel Processor", assigned to the same assignee as the present case, or other suitable devices may be employed as the tone production assigning circuit 56. The key data KD for the channels are provided in time division manner by the tone production assigning circuit 56, and in this case the key data ($N_1$, $O_1$ and $K_1$; $N_2$, $O_2$ and $K_2$; . . . ; $N_n$, $O_n$ and $K_n$) concerning the channels are latched in the musical tone production system 53-1 through 53-n, where they are placed in static state before utilization, respectively.

Circuits 11-1 through 11-12 each identical to the multiplexed data generator circuit 11 described with reference to FIG. 1 are provided for twelve (12) notes C#, D, . . . B and C, respectively. However, the multiplexed data generator circuits 11-1 through 11-12 are different from one another in the input connection state of the AND circuit 21 (FIG. 1) in the digital oscillator section 14 and the set state of the switch 42 (FIG. 1) adapted to slightly change the frequency division factor, so that the submultiple frequency wave data $Q_2$–$Q_7$ corresponding to the musical tone frequencies of the notes C through C# can be provided, in a multiplexed state, on respective output lines 13-1 through 13-12. One example of the input condition ($A_1$–$A_7$) of the AND circuit 21 and the set position ($B_1$–$B_4$) of the switch 42 in each of the sections 11-1 through 11-12 indicated in Table 3 below:

TABLE 3

| | Frequency division factor | | | | | AND circuit 21 | | | | | | | | |
|---|---|---|---|---|---|---|---|---|---|---|---|---|---|---|
| Note | $Q_2$ | 1 | 2 | 3 | 4 | N | $A_1$ | $A_2$ | $A_3$ | $A_4$ | $A_5$ | $A_6$ | $A_7$ | Switch 42 |
| C | 239 | 59 | 60 | 60 | 60 | 59 | 0 | 0 | 0 | 1 | 0 | 1 | 1 | $B_4$ |
| B | 253 | 63 | 63 | 63 | 64 | 63 | 1 | 1 | 1 | 0 | 0 | 0 | 0 | $B_3$ |
| A# | 268 | 67 | 67 | 67 | 67 | 67 | 1 | 0 | 0 | 0 | 1 | 1 | 1 | $B_1$ |
| A | 284 | 71 | 71 | 71 | 71 | 71 | 0 | 1 | 0 | 0 | 1 | 0 | 0 | $B_1$ |
| G# | 301 | 75 | 75 | 75 | 76 | 75 | 0 | 1 | 1 | 0 | 0 | 1 | 0 | $B_3$ |
| G | 319 | 79 | 80 | 80 | 80 | 79 | 1 | 0 | 1 | 1 | 0 | 1 | 1 | $B_4$ |
| F# | 338 | 84 | 85 | 84 | 85 | 84 | 1 | 0 | 1 | 1 | 0 | 1 | 0 | $B_2$ |
| F | 358 | 89 | 90 | 89 | 90 | 89 | 1 | 0 | 1 | 1 | 1 | 1 | 0 | $B_2$ |
| E | 379 | 94 | 95 | 95 | 95 | 94 | 1 | 0 | 0 | 0 | 1 | 1 | 0 | $B_4$ |
| D# | 402 | 100 | 101 | 100 | 101 | 100 | 1 | 0 | 0 | 1 | 0 | 1 | 1 | $B_2$ |
| D | 426 | 106 | 107 | 106 | 107 | 106 | 1 | 0 | 1 | 1 | 1 | 0 | 1 | $B_2$ |
| C# | 451 | 112 | 113 | 113 | 113 | 112 | 1 | 1 | 0 | 0 | 1 | 1 | 1 | $B_4$ |

The number N indicating a frequency division factor in the above-described Table 3 is the period of the relevant submultiple frequency wave signal under the condition that the period of a clock pulse driving the shift registers etc. is taken as a unit. For instance, if the period of the clock pulse is about 1 μs, then the period of a signal obtained from the data $Q_2$ of the tone C is about 239 μs, which is approximately 4184 Hz. This is the frequency of a note $C_8$ in the 8-foot register. Furthermore, the period of a signal obtained from the data $Q_2$ of the tone C# is about 45' μs, which is about 2217 Hz. This is the frequency of the note $C\#_7$ in the 8-foot register. Accordingly, signals having highest frequencies which are obtained from the data $Q_2$ provided by the multiplexed data generator sections 11-1 through 11-12 are those of the note $C\#_7$, $D_7$, $D\#_7$ . . . $A\#_7$, $B_7$ and $C_8$ in the 8-foot register.

In Table 3, the column of "N" shows original frequency division factors obtained in the maximum length counter (i.e., the shift register 16 etc.) in response to the input connection state of the AND circuit 21. The columns of the number 1, 2, 3 and 4 show respective frequency division factors employed for producing the four basic pulse signals P. It will be noted that the respective frequency division factors for the same note are slightly different depending upon the set position of the switch 42. The column of $Q_2$ shows a sum of the four frequency division factors, i.e., the submultiple frequency wave data $Q_2$ corresponding to the highest frequency among the submultiple frequency wave data $Q_2$–$Q_7$ for the respective notes supplied on the output lines 13-1 through 13-12.

Each of the sections 11-1 through 11-12 provides six (6) submultiple frequency wave data $Q_2$–$Q_7$ in a multiplexed state. In this connection, the submultiple frequency wave data $Q_3$ through $Q_7$ correspond to signals obtained by successively subjecting the wave data $Q_2$ to frequency division. Accordingly, the wave data $Q_7$ corresponding to the lowest frequency is a signal obtained by subjecting the data $Q_2$ to 1/32 frequency division, and signals of tones ($C\#_2$, $D_2$, $D\#_2$, . . . $A\#_2$, $B_2$ and $C_3$) lower by five octaves than the aforementioned highest frequency can be obtained from the data $Q_7$. Accordingly, if it is assumed that the period of the clock pulse is 1 μs in FIG. 6, the data $Q_2$ through $Q_7$ corresponding to the musical tone source signals ranging from the note $C\#_2$ to the note $C_8$ in the 8-foot register are provided by each of the multiplexed data generator sections 11-1 through 11-12.

The multiplexed submultiple frequency wave data $Q_2$ through $Q_7$ supplied to the lines 13-1 through 13-12 separately according to the notes are applied to the musical tone production systems 53-1 through 53-n, respectively. A note select circuit 57 in each of the musical tone production systems 53-1 through 53-n selects the multiplexed data $Q_2$–$Q_7$ on a line (one of the lines 13-1 through 13-12) corresponding to the note of a tone assigned to the relevant channel, in accordance with the note data $N_1$ ($N_2$ . . . $N_n$) supplied by the tone production assigning circuit 56. The multiplexed data $Q_2$ through $Q_7$ concerning single notes selected by the note select circuits 57 in the systems 53-1 through 53-n are applied to the wave demultiplexer sections 12-1 through 12-12, respectively. For instance, in the case where the tone C is assigned to the first channel, the note data N, represents the tone C, and therefore the multiplexed data $Q_2$–$Q_7$ on the line 13-1 corresponding to the tone C are selected by the note select circuit 57 and are applied through the line 13A to the wave demultiplexer section 12-1.

The arrangements of the wave demultiplexer sections 12-1 through 12-n are identical to that of the wave demultiplexer section 12 described with reference to FIG. 1. As was described before, in the wave demultiplexer 12-1 through 12-n, the individual wave data $Q_2$–$Q_7$ are separately picked up and lathced from among the multiplexed wave data $Q_2$–$Q_7$. Therefore, in correspondence to the wave data $Q_2$–$Q_7$ of a single note name selected by the note select circuit 57, six octavely-related square wave tone source signals of the same note are provided in a parallel mode by the wave demultiplexed section 12-1 (−12-n). For instance, if the tone C is assigned to the first channel, square wave signals having the frequencies of the note $C_3$, $C_4$, $C_5$, $C_6$, $C_7$ and $C_8$ in the 8-foot register are provided by the wave demultiplexer section 12-1 in correspondence to the wave data $Q_7$, $Q_6$, $Q_5$, $Q_4$, $Q_3$ and $Q_2$, respectively.

The signals having the frequencies of the notes (hereinafter referred to as "note frequency signals", when applicable) in the octaves which are outputted by the wave demultiplexer sections 12-1 through 12-n are applied to tone keyers 58 in the musical tone production systems 53-1 through 53-n. In the tone keyers 58, according to the key-on data $K_1$, $K_2$, . . . $K_n$ of the tones assigned to the channels the note frequency signals of the respective octaves with an amplitude envelope characteristics such as attack and decay envelope characteristics are selected. The amplitude envelope characteristics such as attack and decay envelope characteristics can be provided by utilizing time constant circuits comprising capacitors and resistors, which are selectively charged and discharged according to the presence or absence of the key-on data $K_1$ through $K_n$.

The six note frequency signals of the respective octaves, to which an envelope has been given, are applied to an octave select circuit 59, and the note signals of an octave range represented by the octave data $O_1$ ($O_2$-$O_n$) are selected separately according to a register footage. In this example, musical tones can be produced respectively in four footage registers: 2-foot (2'), 4-foot (4'), 8-foot (8') and 16-foot (16') registers. For instance, if it is assumed that the octave data $O_1$ is representative of the first octave range, and the first octave range includes twelve tones $C\#_3$, $D_3$, $D\#_3$ . . . $A_3$, $B_3$ and $C_4$; then in the octave select circuit 59 of the first channel to which the tone C has been assigned, the signal having the frequency of the note $C_4$ (corresponding to the data $Q_6$) is selected as a musical tone signal in the 8-foot register, the signal having the frequency of the note $C_3$ (corresponding to the data $Q_7$) is selected as a musical tone signal in the 16-foot register, and the signals having the frequencies of the note $C_5$ and $C_6$ (corresponding to the data $Q_5$ and $Q_4$) are selected as musical tone signals in the 4-foot and 2-foot registers. Accordingly, if referred to a single footage register only, out of a plurality of signals having the same note which are in octave relation and are supplied, in a parallel mode, through the switching circuit 58, a single signal covered by the octave range represented by the octave data $O_1$ is selected, and the single signal thus selected is provided, as the tone source signal of the tone (key) assigned to the relevant channel.

The tone source signals provided by the musical tone production system 53-1 through 53-n are subjected to mixing separately according to the footage registers, and are supplied to a tone color controlling filter circuit (not shown).

Figure 7:
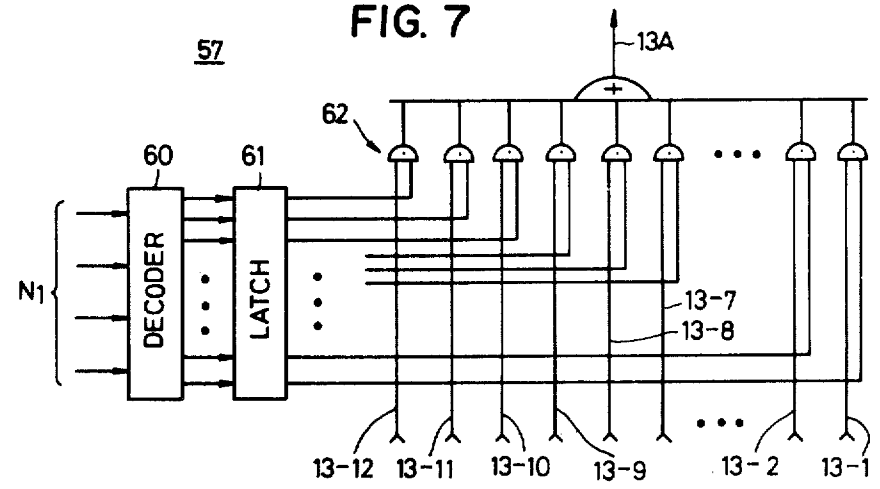
FIG. 7 is a circuit diagram illustrating an example of a note select circuit shown in FIG. 6.

One example of the note select circuit 57 is shown in FIG. 7. The note data $N_1$ is applied in time division manner, for instance, in the form of a 4-bit code signal. This code signal is decoded by a decoder 60, and thereafter is latched by a latch circuit 61. Among the outputs of the latch circuit 61, only one output corresponding to the note represented by the note data $N_1$ is at "1". Twelve AND circuits 62 are provided respectively for the notes, and only one of the twelve AND circuits 62 is enabled in response to the output of the latch circuit 61. Multiplexed wave data supplying lines 13-1 through 13-12 corresponding to the notes are connected to the AND circuits 62, respectively, so that the signal on a single line (one of the lines 13-1 through 13-12) corresponding to a single note is selected by a single AND circuit 62. The outputs of the AND circuits 62 are applied through an OR circuit 63 to a line 13A, and are then applied to the wave demultiplexing section 12-1.

Figure 8:
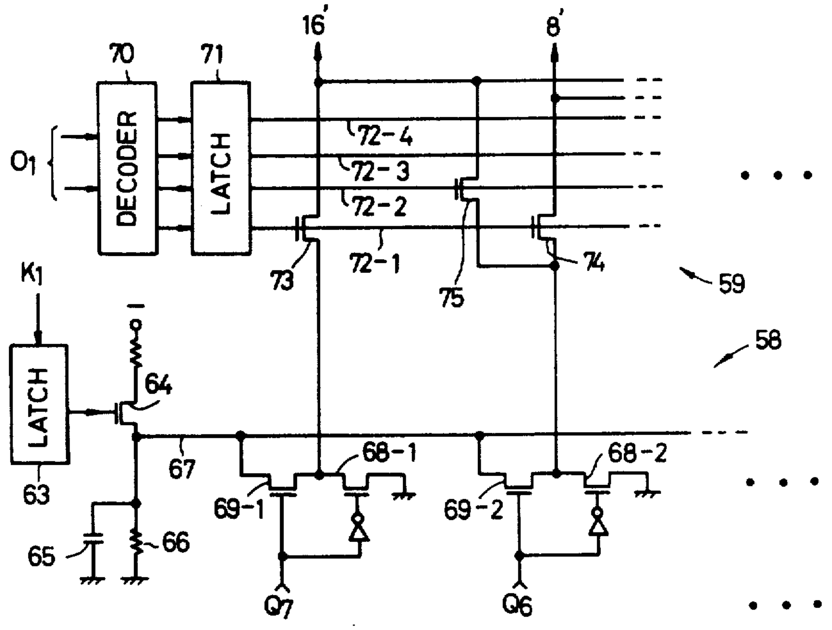
FIG. 8 is a schematic circuit diagram illustrating an example of tone keyers and octave select circuit shown in FIG. 6.

One example of the tone keyers 58 and the octave select circuit 59 is shown in FIG. 8. The key-on data $K_1$ supplied in time division manner is latched by a latch circuit 63, where it is converted into a direct current. When the key-on data $K_1$ is raised to "1" upon key depression, a field-effect transistor 64 is rendered conductive to charge the capacitor 65. When the key-on data $K_1$ is switched to "0" upon key release, the field-effect transistor 64 is rendered non-conductive, as a result of which the capacitor 65 is discharged through a resistor 66. Accordingly, an envelope shape voltage characterizing the attack, sustain and decay of a musical tone amplitude is provided to a line 67. Square wave submultiple frequency wave signals corresponding to the wave data $Q_2$–$Q_7$ outputted by the wave demultiplexer section 12-1 render field-effect transistors 68-1, 68-2, . . . conductive to select the ground voltage, when at the level "0"; on the other hand, they render field-effect transistors 69-1, 69-2, . . . condutive to select the envelope shape voltage on the line 67, when at the level "1". Thus, the levels of the submultiple frequency wave signals are scaled by the envelope shape voltage on the line 67 and are then applied to the octave select circuit 59. The octave data $O_1$ is, for instance, a 2-bit code signal, which is decoded separately according to the octave ranges by a decoder 70 and are held by a latch circuit 71. Field-effect ransistors 73, 74, 75 . . . are provided so that the wave signals of the relevant octave range can be selected with the aid of the signals on octave selection lines 72-1 through 72-4 for every footage register. For instance, with the aid of the signal "1" on the first octave selection line 72-1, the field-effect transistors 73 and 74 are rendered conductive, as a result of which the wave signal corresponding to the wave data $Q_7$ is selected as a signal of the first octave range in the 16-foot register (16'), and the wave signal corresponding to the wave data $Q_6$ is selected as a signal of the first octave range in the 8-foot register (8').

Figure 9:
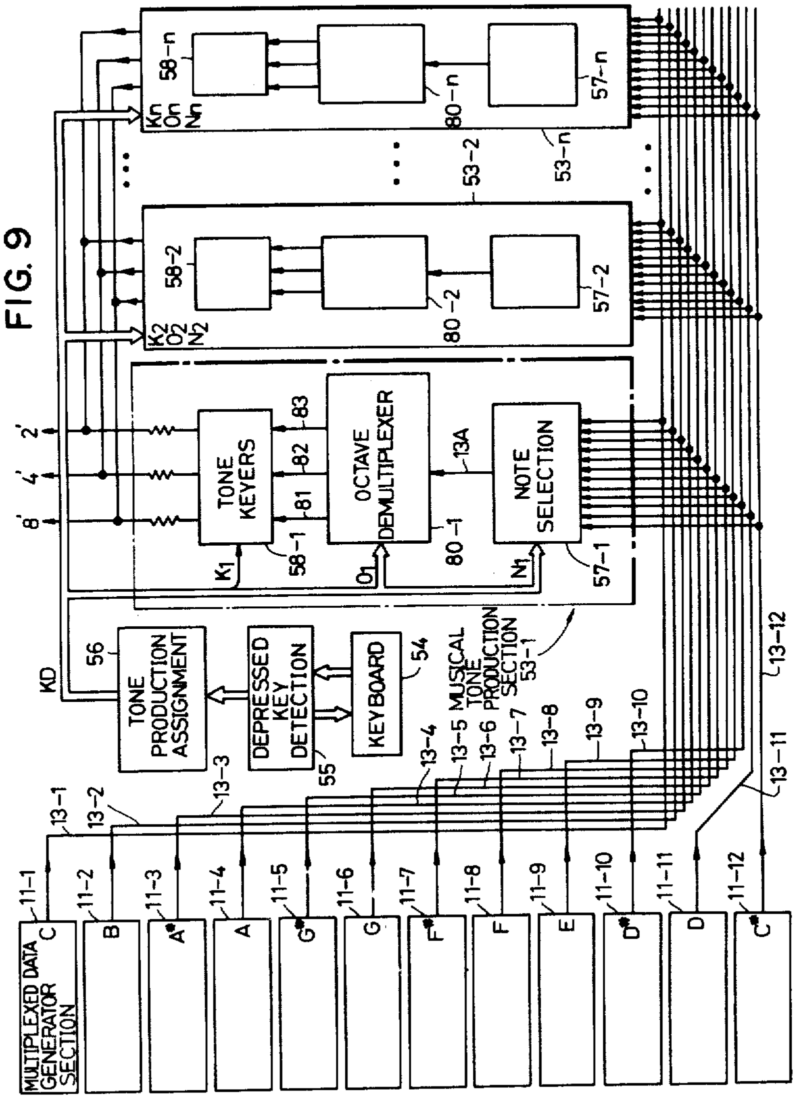
FIG. 9 is a block diagram showing another embodiment of the wave generator according to the invention.

FIG. 9 shows another example of the wave generator according to the invention, which is applied to a tone generator of an electronic musical instrument. The circuitry of FIG. 9 is almost similar to that of FIG. 6. That is, the former is mainly different from the latter in the following points: octave demultiplexer sections 80-1 through 80-n are provided at the past stages of the note select circuits 57-1 through 57-n, respectively, so that among the multiplexed wave data $Q_2$–$Q_7$, which are the outputs of the note select circuits 57-1 through 57-n, the data ($Q_2$–$Q_7$) of tone ranges specified by the octave data $O_1$ through $O_n$ are selected.

Figure 10:
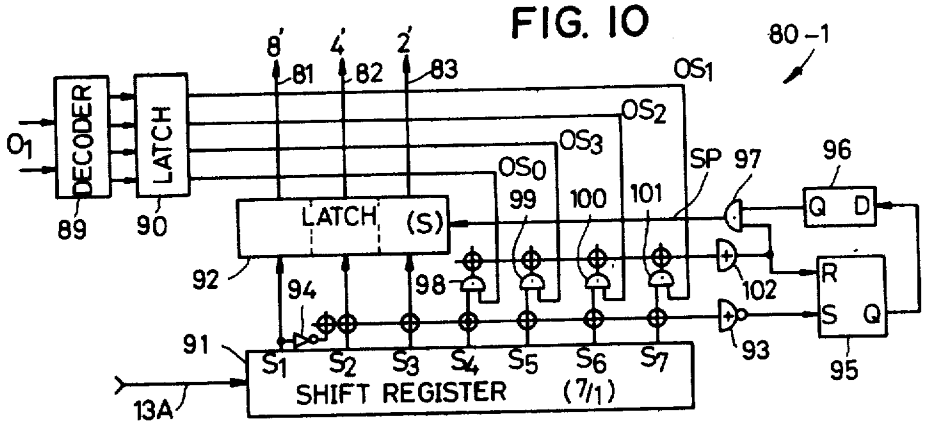
FIG. 10 is a circuit diagram showing an example of an octave demultiplexer section shown in FIG. 9.

FIG. 10 illustrates one example of the octave demultiplexer section 80-1. The arrangements of the other octave demultiplexer sections 80-2 through 80-n are identical to that of the section 80-1. The multiplexed wave data $Q_2$ through $Q_7$ of a note selected by the note select circuit 57-1 are applied through a line 13A to the first stage $S_1$ in a shift register 91. The shift register 91 and delay flip-flops in the octave demultiplexer section 80-1 (80-2 through 80-n) are synchronously operates with the aid of the same clock pulse as that employed for the multiplexed data generator sections 11-1 through 11-12. The shift register 91 is a 7-stage/1-bit shift register which carries out a series shift operation from the first stage $S_1$ to the seventh stage $S_7$. Accordingly, the basic pulse signal P at the top and the wave data $Q_2$–$Q_7$ in succession therewith, which are successively inputted, are successively shifted from the first stage $S_1$ toward the seventh stage $S_7$ as indicated in the part (a) of FIG. 11.

The wave data $Q_2$ through $Q_7$ superposed in a series mode are converted into parallel wave data by the shift register 91. The outputs of the first through third stages $S_1$–$S_3$ in the shift register 91 are connected to the input terminals of a latch circuit 92, respectively. The latch circuit 92 operates to latch a wave data (one of the data $Q_2$–$Q_7$) corresponding to a tone range specified by the octave data $O_1$ and to convert it into a submultiple frequency wave data in a static state (or in the state of an ordinary frequency division signal). In this example, tone source signals in the 8, 4 and 2 foot registers can be provided, and therefore the memory position of the latch circuit 90 is of 3-bits for each footage register. However, if a single footage register is employed, the meory position may be of 1-bit.

A signal obtained by inverting the output of the first stage $S_1$ in the shift register 91 by an inverter 94, and the outputs of the second through seventh stages $S_2$–$S_7$ are applied to a NOR circuit 93. The NOR circuit 93 is to detect the basic pulse signal P (that is, it is to detect the arrival of the wave data trains $D_1$, $D_2$, . . . ). The outputs of the fourth through seventh stages $S_4$–$S_7$ are connected to AND circuits 98 through 101, respectively. These AND circuits 98 through 101 are to dynamically select a wave data (one of the data $Q_2$–$Q_7$) corresponding to a tone range specified by the octave data $O_1$.

For instance, if the octave data $O_1$ is supplied, in the form of a code signal, in time division manner from the tone production assigning circuit 56, then the octave data $O_1$ is decoded by the decoder 89 separately according to the octave ranges. The output of the decoder 89 is latched, where it is placed in a static state. One of the octave select data $OS_1$, $OS_2$, $OS_3$ and $OS_0$ thus obtained through decoding is raised to "1". The relationships among the octave data $O_1$, the octave select data $OS_1$, $OS_2$, $OS_3$ and $OS_0$ obtained by decoding the octave data $O_1$, and tone ranges are indicated in Table 4. The tone ranges indicated in Table 4 are based on the 8-foot register.

TABLE 4

| | $O_1$ | Decode Output | Tone Range (8') |
|---|---|---|---|
| 0 | 1 | $OS_1$ | C#2 - C3 |
| 1 | 0 | $OS_2$ | C#3 - C4 |
| 1 | 1 | $OS_3$ | C#4 - C5 |
| 0 | 0 | $OS_0$ | C#5 - C6 |

The tone ranges C#2–C3, C#3–C4, C#4–C5, and C#5–C6 will be referred to as first, second, third and fourth tone ranges, respectively. In the case where the octave data $O_1$ is supplied in a static state by the tone production assigning circuit 56, the provision of the latch circuit 90 is unnecessary. The octave select data $OS_1$ corresponding to the first tone range is applied to the AND circuit 101, and the octave select data $OS_2$ corresponding to the second tone range is applied to the AND circuit 100. The octave select data $OS_3$ corresponding to the third tone range is applied to the AND circuit 99, and the octave select data $OS_0$ corresponding to the fourth tone range is applied to the AND circuit 98. Accordingly, a single AND circuit (one of the AND circuits 98 through 101) corresponding to a tone range specified by the octave data $O_1$ (that is, the tone range of a tone assigned to the relevant channel) is enabled. When the basic pulse signal P is shifted to a stage (one of the stages $S_4$–$S_7$) corresponding to the AND circuit (98–101) thus enabled, the AND circuit operates so as to supply the output "1" to the OR circuit 102.

The arrival of the basic pulse signal P, that is, the arrival of the frequency division data $Q_2$–$Q_7$ is detected as follows:

As the wave data $Q_2$–$Q_7$ are delivered after the basic pulse signal P at all times, no signal is applied to the line 13A for the period of at least six bit-times immediately before the arrival of the basic pulse signal P (the line being at "0"). Therefore, when the basic pulse signal P is inputted into the first stage $S_1$ in the shift register 91, the outputs of the second stage $S_2$ *through the seventh stage $S_7$*, which represent the signal state of the six bit-times immediately before that are all at "0". This is indicated in correspondence to the timing $t_1'$. When the basic pulse signal P is inputted into the first stage $S_1$ in the shift register 91, the output of the first stage $S_1$ is raised to "1", while the output of the inverter 94 is switched to "0". The output of the inverter 94 and the outputs of the second through seventh stages $S_2$–$S_7$ are applied to the NOR circuit 93. The NOR circuit 93 provides the output "1" at the time instant of the timing $t_1'$.

The output of the NOR circuit 93 is applied to the set input terminal S of a reset-set type flip-flop 95. As a result, the flip-flop 95 is placed in a set state as indicated in the part (b) of FIG. 11, and its set output, after being displayed by the delay flip-flop 96 as indicated in the part (c) of FIG. 11, is applied to an AND circuit 97, as a result of which the latter 97 is enabled.

The outputs of the above-described AND circuits 98 through 101 are applied through the OR circuit 102 to the other input terminal of the AND circuit 97, and to the reset input terminal R of the flip-flop 95. As the basic pulse signal P goes before the wave data $Q_2$–$Q_7$ at all times, when the signal "1" is provided by the AND circuits 98–101 with the aid of the basic pulse signal P, an initial reset signal is applied to the flip-flop 95 to reset the latter 95. At the same time, the AND condition of the AND circuit 97 is satisfied, and the output "1" of the AND circuit 97 is applied to the strobe unit input terminal (S) of the latch circuit 92. When the flip-flop 95 is reset, one bit-time later the output of the delay flip-flop 96 is switched to "0". Therefore, even if the output "1" is provided by the OR circuit 102 thereafter, the AND circuit 97 does not operate. Accordingly, the strobe pulse SP which is applied to the latch circuit 92 by the AND circuit 97 is provided only for the period of one-bit time. The timing with which the strobe pulse SP occurs is determined by the octave select data $OS_1$, $OS_3$ and $OS_0$.

Figure 11:
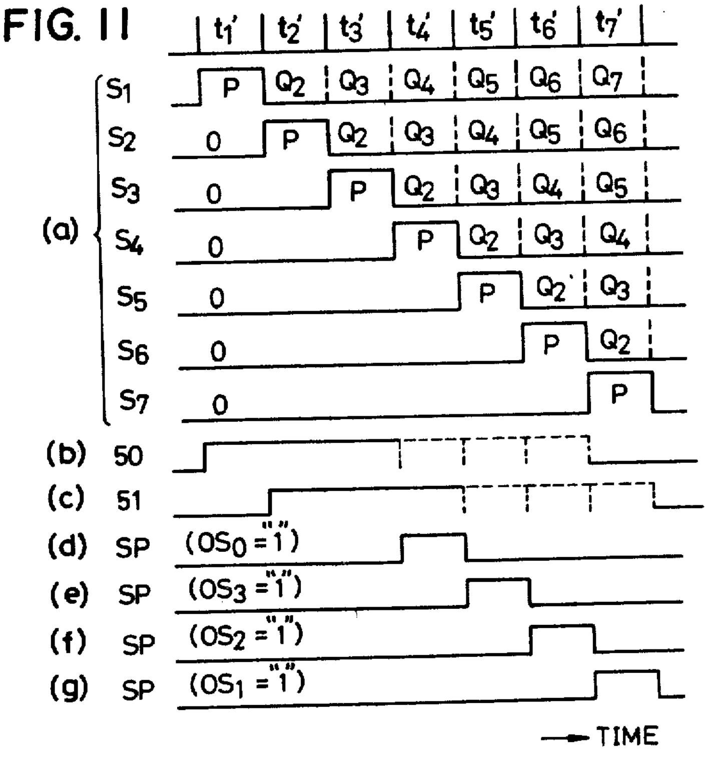
FIG. 11 is a timing chart for explaining the operation of the circuit shown in FIG. 10.

In the case where the octave select data $OS_0$ is at "1", the AND circuit 98 operates when the basic pulse signal P is inputted into the fourth stage $S_4$ in the shift register 91, and the strobe pulse SP is provided at the timing $t_4'$ (the part (d) of FIG. 11). Therefore, the frequency division $Q_4$, $Q_3$ and $Q_2$ are inputted from the stages $S_1$–$S_2$ of the shift register 91 into the latch circuit 92 (cf. the part (a) of FIG. 11). Whenever the wave data $Q_2$–$Q_7$ is applied, or whenever the wave trains $D_1$, $D_2$, $D_3$ . . . (cf. Table 2) together with the basic pulse signal P are applied, the data contents of the wave data $Q_4$, $Q_3$ and $Q_2$ stored in the latch circuit 92 are rewritten. The levels ("1" and "0") of the signals outputted from the memory positions in the latch circuit 92 are changed whenever the logical levels of the wave data $Q_2$–$Q_4$ applied through the line 13A are changed. Accordingly, only the square-wave-like tone source signal corresponding to the wave data $Q_2$–$Q_4$ of the tone range actually produced in the wave data provided by the multiplexed data generator sections 11-1 through 11-12, is outputted by the latch circuit 92. The parts (e) and (f) of FIG. 5 are to indicate that the output of the latch circuit 47 is a square wave, and illustrates square wave tone source signals which are outputted by the latch circuit 92 by basing on the wave data $Q_2$ and $Q_3$.

Incidentally, the output signal of the memory position in the latch circuit 92, which has latched the data of the first stage $S_1$ in the shift register 91, is outputted, as a tone source signal in the 8-foot register, through a line 81. In this example, as the wave data $Q_2$–$Q_7$ are converted into direct current signals in the order of the increasing frequency division factor, the frequency division data higher by one octave than that in the first stage $S_1$ in the second stage $S_1$ of th shift register 91. Accordingly, the output signal of the memory position in the latch circuit 92, which has latched the data of the second stage $S_2$, corresponds to a tone source signal in the 4-foot register, and it is outputted through the line 72. As the frequency division data higher by one octave than that in the second stage $S_2$ is inputted into the third stage $S_3$, the output signal of the memory position in the latch circuit 92, which has latched the data of the third stage corresponds to a tone source signal in the 2-foot register, and it is outputted through the line 83.

In the case where the octave select data $OS_3$ representative of the third tone range is at "1", the strobe pulse SP is provided when the basic pulse signal P is inputted into the stage $S_5$ in the shift register 91. Therefore, as indicated in the part (e) of FIG. 8, at the timing $t_5'$ the strobe pulse SP is produced, and the wave data $Q_5$, $Q_4$ and $Q_2$ are latched by the latch circuit 92. In the case where the octave select data $OS_2$ representative of the second tone range is at "1", when the basic pulse signal P is inputted into the sixth stage $S_6$ of the shift register 91, the AND circuit 100 operates, as a result of which the strobe pulse SP is produced as indicated in the part (f) of FIG. 8, and the frequency division data $Q_6$, $Q_5$ and $Q_4$ are latched by the latch circuit 92. In the case where the octave selected data $OS_1$ representative of the first tone range is at "1", when the basic pulse signal P is inputted into the seventh stage of the shift register 91, the AND circuit 101 operates, as a result of which the strobe pulse SP is provided at the timing $t_7'$ are indicated in the part (g) of FIG. 11. Thus, the wave data $Q_7$, $Q_6$ and $Q_5$ inputted into the first through third stages $S_1$–$S_3$ of the shift register 91 (cf. the timing $t_7'$ in the part (a) of FIG. 11) are latched by the latch circuit 92.

As is apparent from the above description, in the octave demultiplexer circuit 80-1 (80-2 - 80-n), only the frequency division signal of the tone range corresponding to the octave data $O_1$($O_2$–$O_n$) is outputted through the line 81 (or 82 or 83). The wave signals of the other tone ranges may exist as the wave data $Q_2$–$Q_7$ multiplexed in a series mode, but cannot exist as submultiple frequency wave signals which can be individually utilized immediately. In the above-described example, as the number of the footage registers is plural, the latch circuit 92 has a plurality of bits so as to provide a plurality of submultiple frequency wave signals. However, in this case, unlike the conventional case, no necessary submultiple frequency wave signals are produced. If the number of footage registers is made to be only one, then the latch circuit 92 may be of a single bit, so as to produce only the submultiple frequency wave signal of a single octave range.

Th submultiple frequency wave signals (square wave tone source signals) generated by the octave demultiplexer sections 80-1 through 80-n are applied to the tone keyers 58-1 through 58-n, respectively. In the tone keyers 58-1 through 58-n of the channels, the tone source signals are keyed(gated) according to the key-on date $K_1$, $K_2$ . . . $K_n$ of the tone assigned to the channels. The tone source signals outputted by the tone keyer circuits 58-1 through 58-n are subjected to mixing in the respective musical tone generating systems 53-1 through 53-n, separately according to the footage registers, and are supplied to the tone color filters (now shown).

What is claimed is:

1. A wave generator comprising:

a first means to generate a basic pulse having a basic period which defines a basic frequency;

a second means to generate time division multiplexed data each one of which occures in a corresponding time division multiplex regular time interval and defines the state of a corresponding wave having a frequency which is submultiple-related to said basic frequency, the data in each different corresponding time interval defining a respective different submultiple-related frequency;

a third means to deliver said basic pulse and said time division multiplexed data;

a fourth means demultiplexing the delivered basic pulse and data from said third means to form individual waves from the respective data in each of said regular time intervals, each wave having a frequency defined by said respective multiplexed data.

2. A signal generator as claimed in claim 1, in which said data are square waves consisting of binary logical level which represent the state of the corresponding square wave at respective time division multiplex time intervals, said second means is a means which generates a plurality of such square waves different in frequency in a multiplexed state on a single digital data line or digital data lines the number of which is smaller than the number of said square waves, and said fourth means is a means which picks up separately said binary logical levels generated in a multiplexed state on said digital data line or lines and establishes therefrom the corresponding square waves.

3. A signal generator as claimed in claim 2, in which said second means is a means which, whenever the logical level of at least the square wave having the highest frequency is switched, generates sucessively, in a series of mode, the logical level data representing the other square waves, and said fourth means is a means which stores and holds in parallel the logical level data applied thereto in series, and rewrites the data thus stored whenever new logical level data is applied thereto.

4. A signal generator as claimed in claim 3, in which said second means is a means which, prior to the logical level data of said square waves, generates a timing signal with respect to which said regular time intervals are located, said regular time intervals containing said square wave representative logical levels, and said fourth means is a means which carries out memory rewriting operation according to said timing signal.

5. A signal generator as claimed in claim 2, in which said second means comprises an oscillation section adapted to generate a pulse signal having a desired frequency, and a circuit for transmitting in series frequency division data which are obtained by successively frequency dividing said basic pulse, and said fourth means comprises a shift register adapted to arrange in parallel said frequency division data transmitted in series, and a latch circuit for storing said frequency division data thus arranged in parallel.

6. A signal generator as claimed in claim 4 wherein said timing signal comprises said basic pulse.

7. A signal generator as claimed in claim 1 wherein said second means comprises;

a memory register having a number of storage locations corresponding to the basic frequency plus the total number of submultiple-related frequencies represented by said multiplexed data, and means for shifting out serially the data stored in said memory register upon occurrence of each basic pulse, and for adding the basic pulse to the least significant position of said serially shifted out data and reentering the resultant data into said memory register, the serially shifted out data being said generated time division multiplexed data.

8. A submultiple-related frequency wave generator comprising:

a digital oscillator means for producing basic pulses which occur at a repetitive rate corresponding to a specific frequency, and submultiple frequency data forming means, cooperating with said digital oscillator means and receiving said basic pulses, for transmitting, upon each occurrence of said basic pulse, a serial data signal consisting of said basic pulse and a binary number having a certain number of bits, and for incrementing said binary number upon repetitive occurrences of said basic pulses, each bit in said transmitted binary number thereby representing the state of a respective square wave which is a submultiple of said specific frequency.

9. A frequency wave generator according to claim 8 further comprising:

wave demultiplexing means, connected to receive each of said transmitted basic pulses and binary numbers, for recovering therefrom each of said respective square waves and providing the same on respective separate parallel output lines.

10. A frequency wave generator according to claim 9 wherein said wave demultiplexing means comprises:

a shift register into which each received basic pulse and binary number is serially shifted.

a latch having a number of stages corresponding to the numbe of bits in said transmitted binary number, and detection logic for gating said binary number from said shift register to said latch upon receipt of the complete transmitted binary number.

11. A time division multiplexed submultiple-related frequency wave generator comprising:

multiplexed data generator means for transmitting at repetitive time intervals a binary number having a certain number of bits, said repetitive time intervals corresponding to a certain frequency, said binary number being incremented upon successive transmissions, and wave demultiplexing means, connected to receive said transmitted binary numbers, for entering each received binary number into a latch circuit containing a number of stages corresponding to said certain number of bits, the contents of each latch stage thereby being updated upon each receipt of said binary number at each repetitive interval, the contents of each latch stage thereby representing a square wave having a respective frequency that is a different submultiple of said certain frequency.

* * * * *